(12) United States Patent
Huang et al.

(10) Patent No.: US 10,991,757 B2
(45) Date of Patent: Apr. 27, 2021

(54) MAGNETORESISTIVE RANDOM ACCESS MEMORY

(71) Applicant: UNITED MICROELECTRONICS CORP., Hsin-Chu (TW)

(72) Inventors: Ting-Hsiang Huang, Tainan (TW);
Yi-Chung Sheng, Tainan (TW);
Sheng-Yuan Hsueh, Tainan (TW);
Kuo-Hsing Lee, Hsinchu County (TW);
Chih-Kai Kang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/430,437

(22) Filed: Jun. 4, 2019

(65) Prior Publication Data

US 2020/0357850 A1 Nov. 12, 2020

(30) Foreign Application Priority Data

May 9, 2019 (CN) .......................... 201910384092.0

(51) Int. Cl.
*H01L 27/22* (2006.01)
*H01L 43/08* (2006.01)
*H01L 43/02* (2006.01)

(52) U.S. Cl.
CPC ............ *H01L 27/224* (2013.01); *H01L 43/02* (2013.01); *H01L 43/08* (2013.01)

(58) Field of Classification Search
CPC ........ H01L 27/224; H01L 43/02; H01L 43/08
See application file for complete search history.

(56) References Cited

U.S. PATENT DOCUMENTS

| 10,276,784 | B1* | 4/2019 | Yu ........................... H01L 43/08 |
| 10,714,466 | B1* | 7/2020 | Chu ...................... H01L 27/224 |
| 2010/0200939 | A1 | 8/2010 | Hosomi | |
| 2013/0334487 | A1* | 12/2013 | Nomachi ................ H01L 45/12 257/4 |
| 2014/0210021 | A1* | 7/2014 | Zhu ........................ G11C 11/161 257/421 |
| 2014/0346624 | A1 | 11/2014 | Shoji | |
| 2017/0092692 | A1* | 3/2017 | Kalnitsky ............... H01L 43/12 |
| 2017/0263850 | A1* | 9/2017 | Ito .......................... H01L 27/228 |
| 2018/0212140 | A1* | 7/2018 | Noh ........................ H01L 43/08 |
| 2019/0006230 | A1* | 1/2019 | Kuo ..................... H01L 23/5329 |
| 2019/0304523 | A1* | 10/2019 | O'Brien ................ G11C 11/161 |
| 2020/0006638 | A1* | 1/2020 | Chen ....................... H01L 43/02 |
| 2020/0035908 | A1* | 1/2020 | Ku .......................... H01L 43/08 |

\* cited by examiner

*Primary Examiner* — Christine A Enad
(74) *Attorney, Agent, or Firm* — Winston Hsu

(57) ABSTRACT

A semiconductor device includes: a substrate having a magnetic tunneling junction (MTJ) region and a logic region; a magnetic tunneling junction (MTJ) on the MTJ region, wherein a top view of the MTJ comprises a circle; and a first metal interconnection on the MTJ. Preferably, a top view of the first metal interconnection comprises a flat oval overlapping the circle.

8 Claims, 8 Drawing Sheets

US 10,991,757 B2

MAGNETORESISTIVE RANDOM ACCESS MEMORY

BACKGROUND OF THE INVENTION

1. Field of the Invention

The invention relates to a semiconductor device, and more particularly to a magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a semiconductor device includes: a substrate having a magnetic tunneling junction (MTJ) region and a logic region; a magnetic tunneling junction (MTJ) on the MTJ region, wherein a top view of the MTJ comprises a circle; and a first metal interconnection on the MTJ. Preferably, a top view of the first metal interconnection comprises a flat oval overlapping the circle.

According to an embodiment of the present invention, the flat oval preferably includes a first tangent line extending along a first direction and a second tangent line extending along the first direction, in which the first tangent line and the second tangent line are in parallel.

According to an embodiment of the present invention, the flat oval includes a first curve on one side of the circle and connecting the first tangent line and the second tangent line and a second curve on another side of the circle and connecting the first tangent line and the second tangent line.

According to an embodiment of the present invention, the flat oval includes a short axis extending along a second direction and a ratio of the short axis to a diameter of the circle is greater than 0.7 and less than 1.3.

According to an embodiment of the present invention, the first direction is orthogonal to the second direction.

According to an embodiment of the present invention, the flat oval includes a long axis extending along the first direction and a ratio of the long axis to a diameter of the circle is greater than 2 and less than 3.3.

According to an embodiment of the present invention, a second metal interconnection is disposed on the logic region, in which a top view of the second metal interconnection comprises a quadrilateral.

According to an embodiment of the present invention, the first metal interconnection and the second metal interconnection are on a same level.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
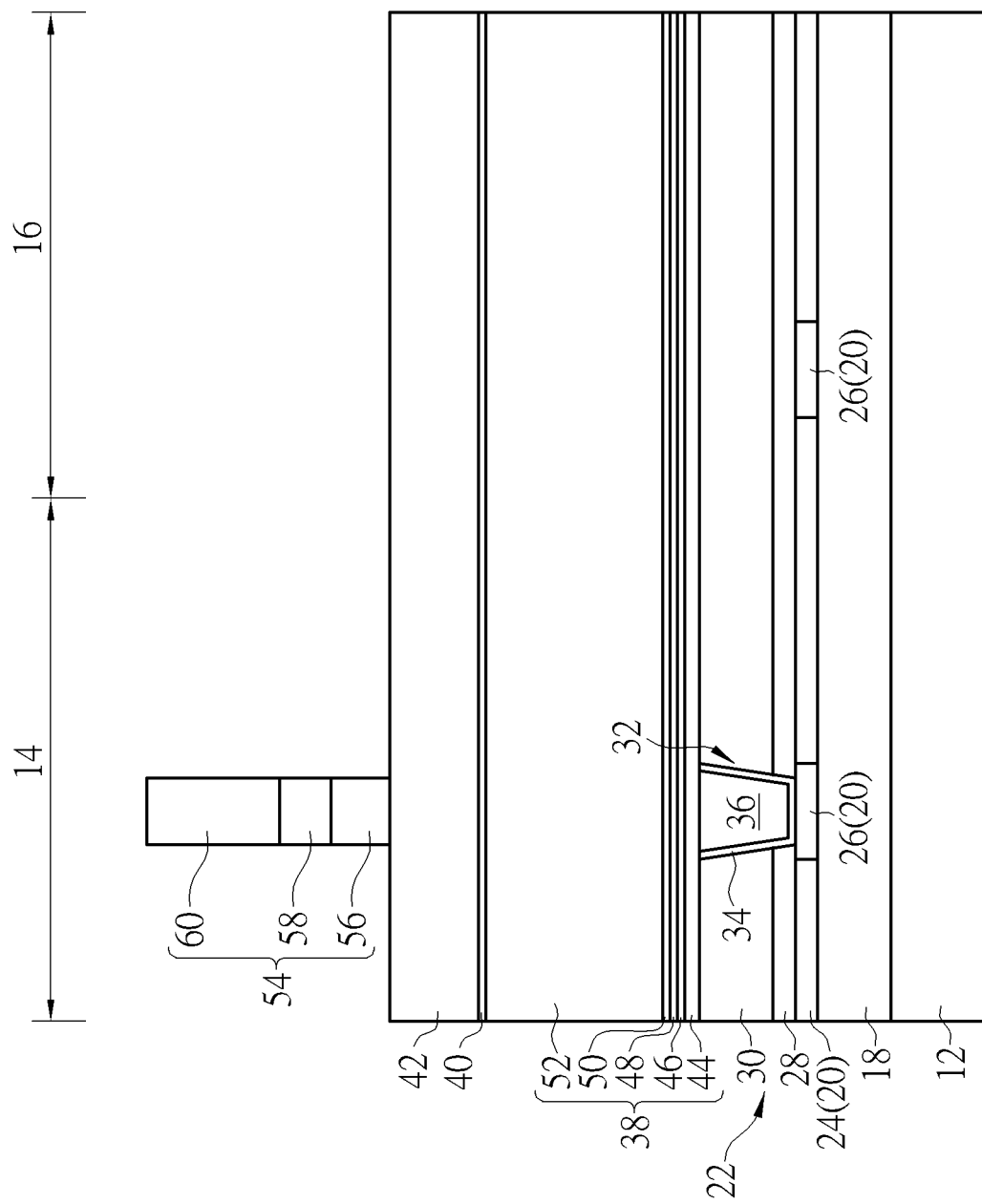
FIGS. 1-6 illustrate a method for fabricating a MRAM device according to an embodiment of the present invention.

Referring to FIGS. 1-6, FIGS. 1-6 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region 80, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MTJ region 14 and the edge region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and each of the metal interconnections 32 from the metal interconnect structure 22 on the MTJ region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a MTJ stack 38 or stack structure is formed on the metal interconnect structure 22, a cap layer 40 is formed on the MTJ stack 38, and another cap layer 42 formed on the cap layer 40. In this embodiment, the formation of the MTJ stack 38 could be accomplished by sequentially depositing a first electrode layer 44, a fixed layer 46, a free layer 48, a capping layer 50, and a second electrode layer 52 on the IMD layer 30. In this embodiment, the first electrode layer 44 and the second electrode layer 52 are preferably made of conductive material including but not limited to for example Ta, Pt, Cu, Au, Al, or combination thereof. The fixed layer 46 could be made of antiferromagnetic (AFM) material including but not limited to for example ferromanganese (FeMn), platinum manganese (PtMn), iridium manganese (IrMn), nickel oxide (NiO), or combination thereof, in which the fixed layer 46 is formed to fix or limit the direction of magnetic moment of adjacent layers. The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field. The capping layer 50 could be made of insulating material including but not limited to for example oxides such as aluminum oxide (AlO$_x$) or magnesium oxide (MgO). Preferably, the cap layer 40 and cap layer 42 are made of different materials. For instance, the cap layer 40 is preferably made of silicon nitride and the cap layer 42 is made of silicon oxide, but not limited thereto.

Next, a patterned mask 54 is formed on the cap layer 42. In this embodiment, the patterned mask 54 could include an organic dielectric layer (ODL) 56, a silicon-containing hard mask bottom anti-reflective coating (SHB) 58, and a patterned resist 60.

Figure 2:
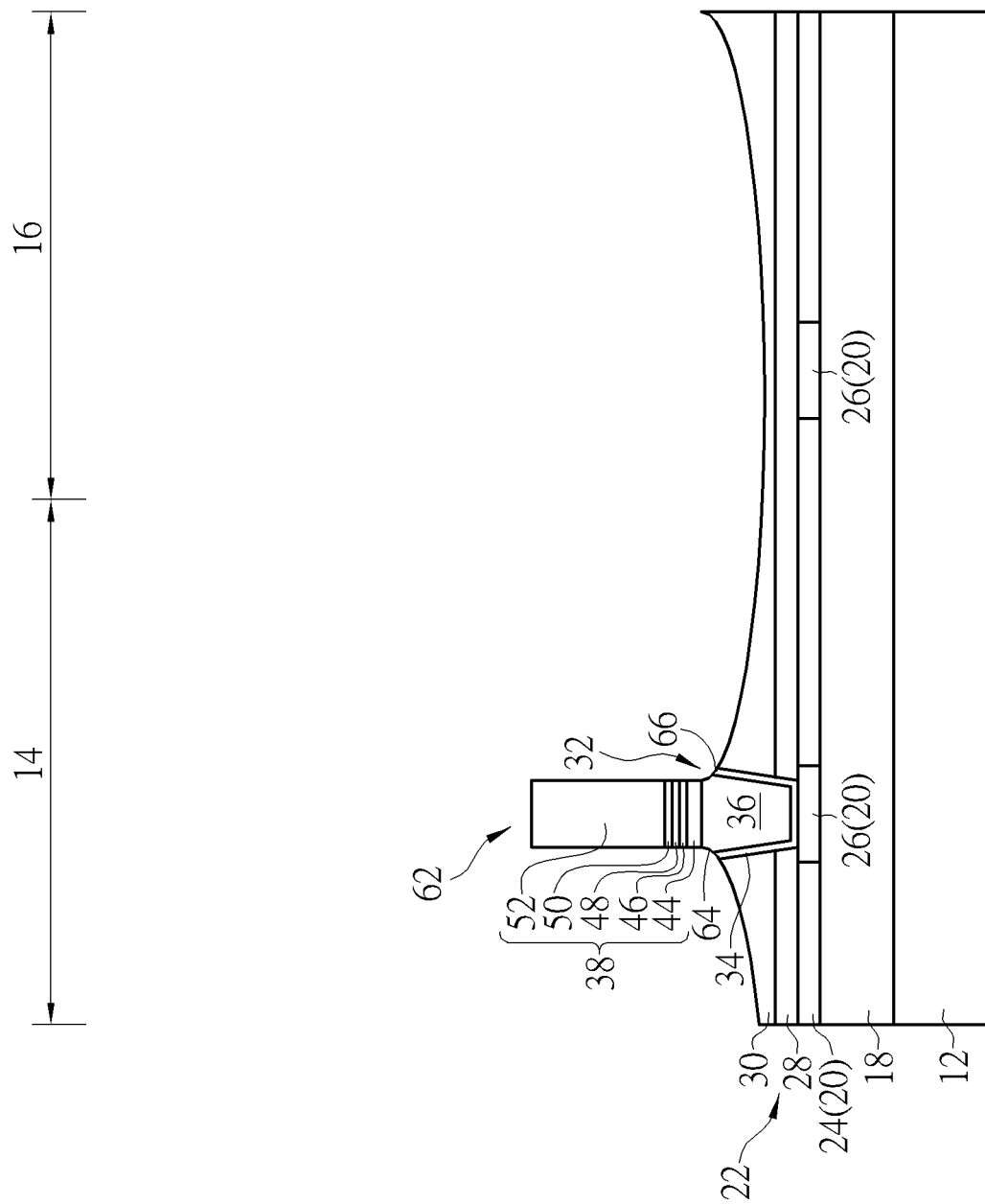

Next, as shown in FIG. 2, one or more etching process is conducted by using the patterned mask 54 as mask to remove part of the cap layers 40, 42, part of the MTJ stack 38, and part of the IMD layer 30 to form a MTJ 62 on the MTJ region 14, in which the first electrode layer 44 at this stage preferably becomes a bottom electrode 76 for the MTJ 62 while the second electrode layer 52 becomes a top electrode 78 for the MTJ 62 and the cap layers 40, 42 could be removed during the etching process. It should be noted that this embodiment preferably conducts a reactive ion etching (RIE) process by using the patterned mask 54 as mask to remove part of the cap layers 40, 42 and part of the MTJ stack 38, strips the patterned mask 54, and then conducts an ion beam etching (IBE) process by using the patterned cap layer 42 as mask to remove part of the MTJ stack 38 and part of the IMD layer 30 to form MTJ 62. Due to the characteristics of the IBE process, the top surface of the remaining IMD layer 30 is slightly lower than the top surface of the metal interconnections 32 after the IBE process and the top surface of the IMD layer 30 also reveals a curve or an arc.

It should also be noted that when the IBE process is conducted to remove part of the IMD layer 30, part of the metal interconnections 32 are removed at the same time so that a first slanted sidewall 64 and a second slanted sidewall 66 are formed on the metal interconnections 32 adjacent to the MTJ 62, in which each of the first slanted sidewall 64 and the second slanted sidewall 66 could further include a curve (or curved surface) or a planar surface.

Figure 3:
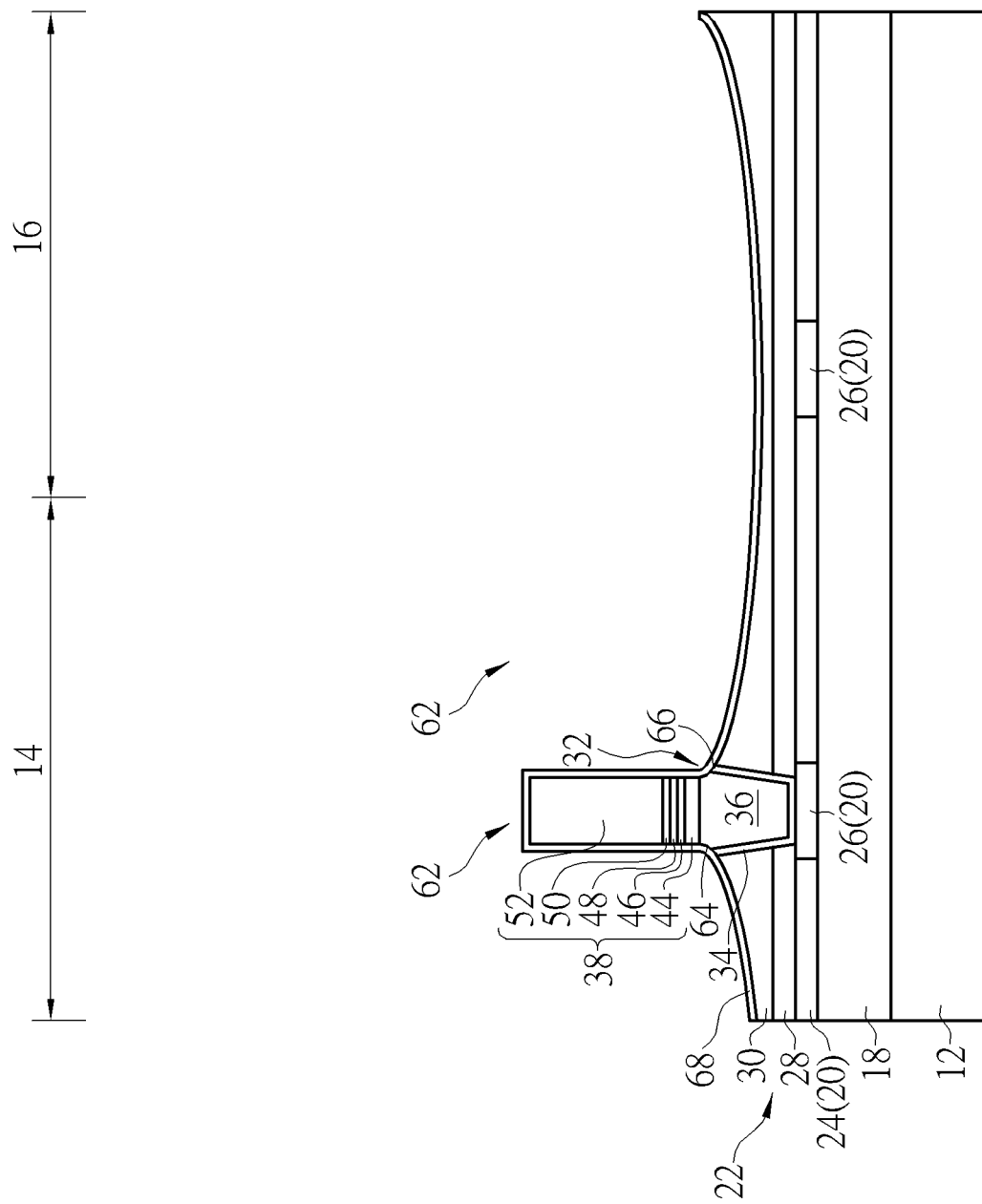

Next, as shown in FIG. 3, a liner 68 is formed on the MTJ 62 to cover the surface of the IMD layer 30. In this embodiment, the liner 68 is preferably made of silicon oxide, but could also be made of other dielectric material including but not limited to for example silicon oxide, silicon oxynitride, or silicon carbon nitride.

Figure 4:
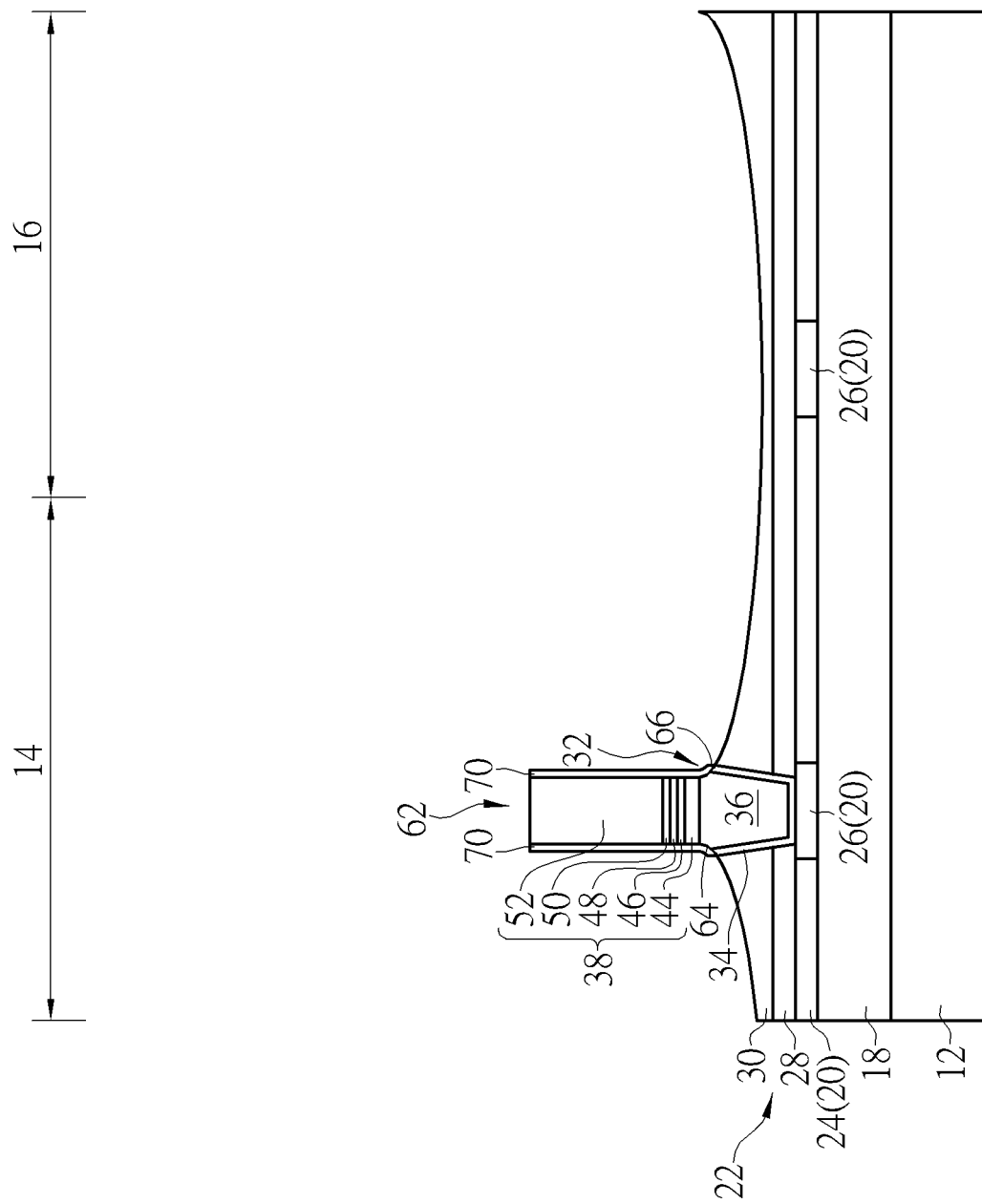

Next, as shown in FIG. 4, an etching process is conducted to remove part of the liner 68 to form a spacer 70 adjacent to each of the MTJ 62, in which the spacer 70 is disposed on sidewalls of the MTJ 62 while covering the first slanted sidewalls 64 and the second slanted sidewall 66 of the metal interconnection 32 directly.

Figure 5:
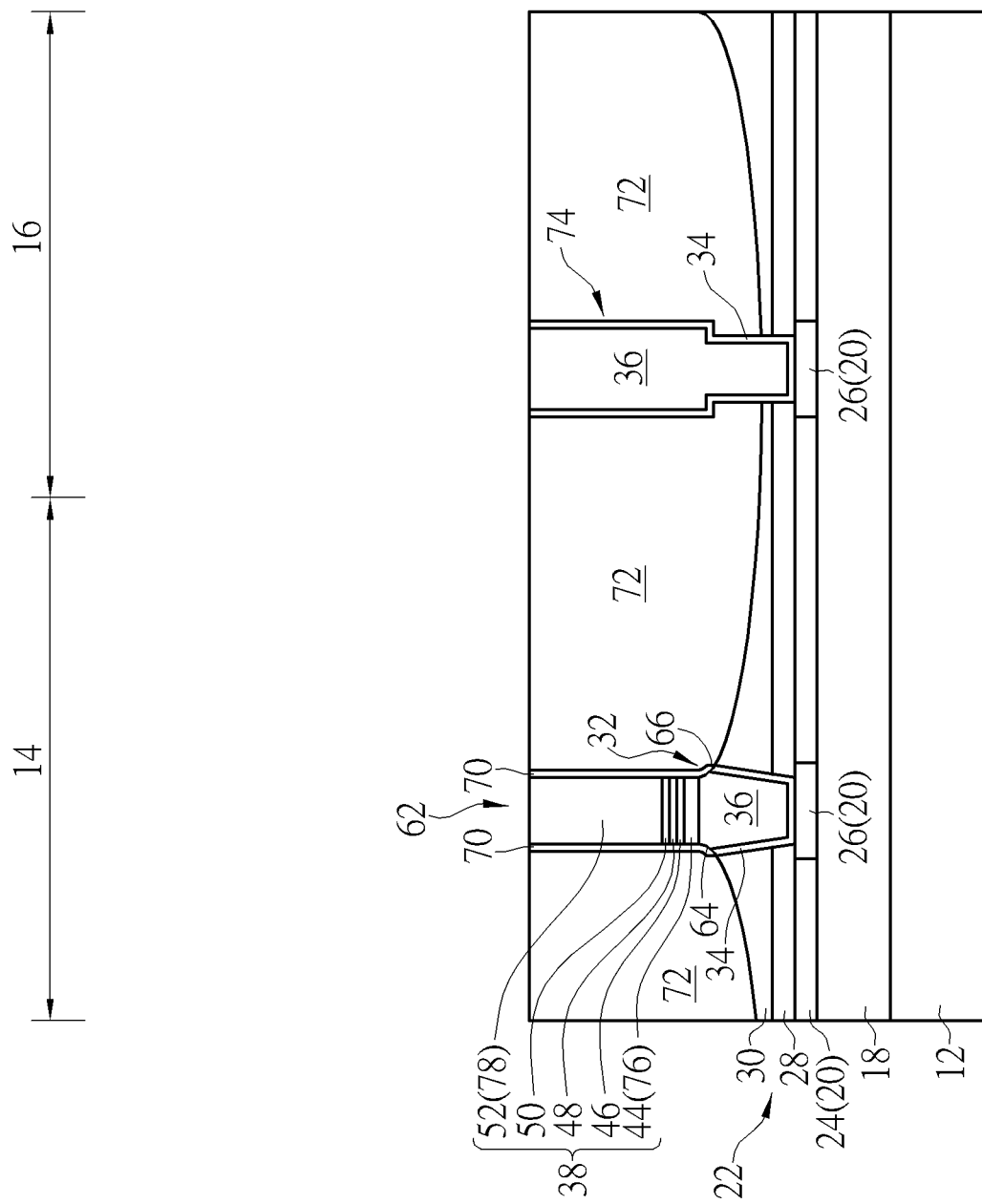

Next, as shown in FIG. 5, another IMD layer 72 is formed on the MTJ region 14 and logic region 16, and a planarizing process such as CMP is conducted to remove part of the IMD layer 72 so that the top surface of the IMD layer 72 is even with the top surface of the MTJ 62. Next, a pattern transfer process is conducted by using a patterned mask (not shown) to remove part of the IMD layer 72 on the logic region 16 to form a contact hole (not shown) exposing the metal interconnection 26 underneath and metals are deposited into the contact hole afterwards. For instance, a barrier layer 34 selected from the group consisting of titanium (Ti), titanium nitride (TiN), tantalum (Ta), and tantalum nitride (TaN) and metal layer 36 selected from the group consisting of tungsten (W), copper (Cu), aluminum (Al), titanium aluminide (TiAl), and cobalt tungsten phosphide (CoWP) could be deposited into the contact holes, and a planarizing process such as CMP could be conducted to remove part of the metals including the aforementioned barrier layer and metal layer to form a contact plug in the contact hole electrically connecting the metal interconnection 26.

Figure 6:
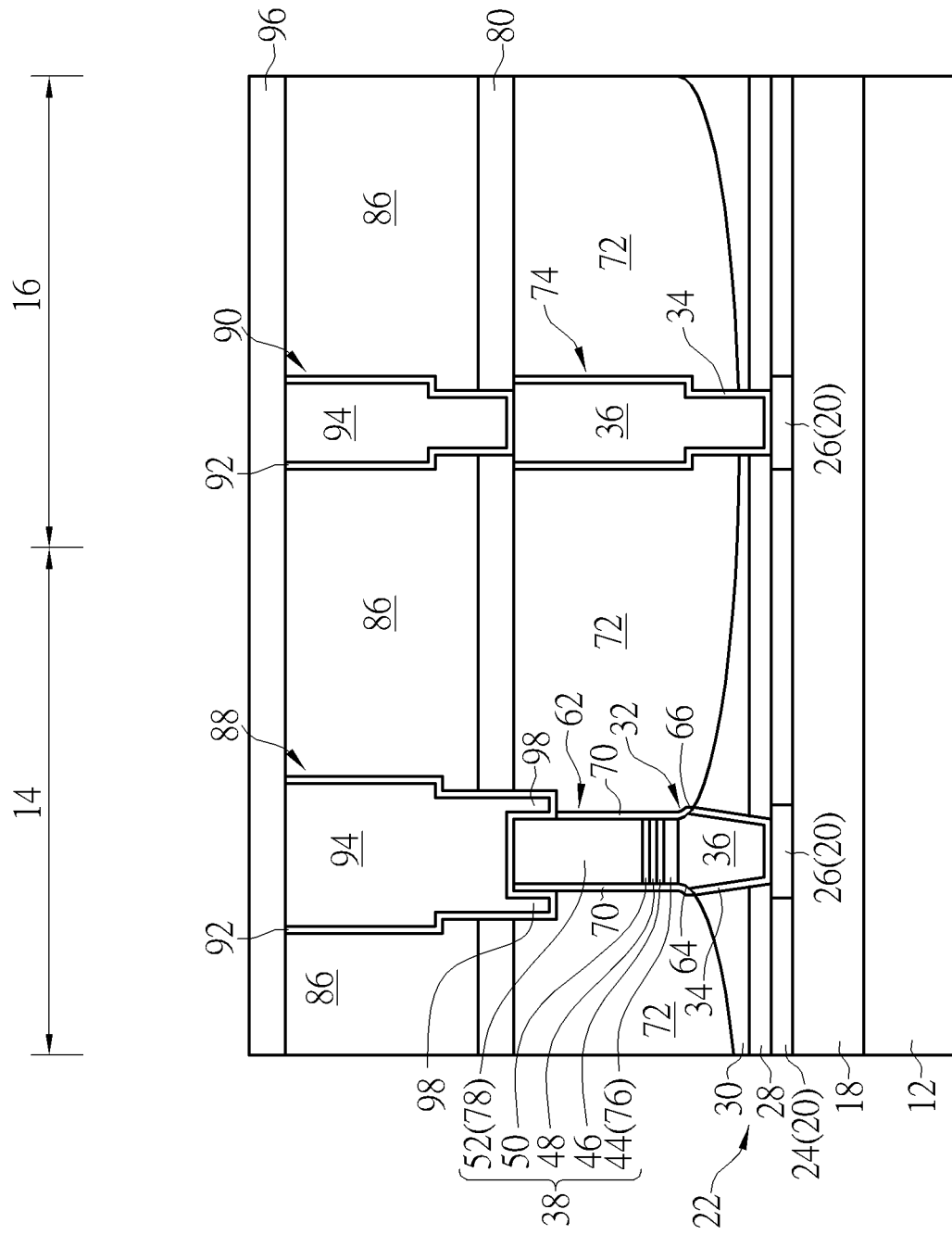

Next, as shown in FIG. 6, a stop layer 80 and another IMD layer 86 are formed on the MTJ 62 to cover the surface of the IMD layer 72, and one or more photo-etching process is conducted to remove part of the IMD layer 86, part of the stop layer 80, part of the IMD layer 72, and even part of the spacer 70 on the MTJ region 14 and part of the IMD layer 86 and part of the stop layer 80 on the logic region 16 to form contact holes (not shown). Next, conductive materials are deposited into each of the contact holes and a planarizing process such as CMP is conducted to form metal interconnections 88, 90 directly connecting the MTJ 62 and contact plug 74 on the MTJ region 14 and logic region 16, in which the metal interconnection 88 on the MTJ region 14 directly contacts the MTJ 62 underneath while the metal interconnection 90 on the logic region 16 directly contacts the contact plug 74 on the lower level. Next, another stop layer 96 is formed on the IMD layer 86 to cover the metal interconnections 88, 90.

In this embodiment, the stop layer 80 and the stop layer 28 could be made of same material or different material. For example, both layers 80, 28 could include nitrogen doped carbide (NDC), silicon nitride, silicon carbon nitride (SiCN), or combination thereof. Similar to the metal interconnections formed previously, each of the metal interconnections 88, 90 could be formed in the IMD layer 86 through a single damascene or dual damascene process. For instance, each of the metal interconnections 88, 90 could further include a barrier layer 92 and a metal layer 94, in which the barrier layer 92 could be selected from the group consisting of titanium (Ti), titanium nitride (TiN), tantalum (Ta), and tantalum nitride (TaN) and the metal layer 94 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Figure 7:
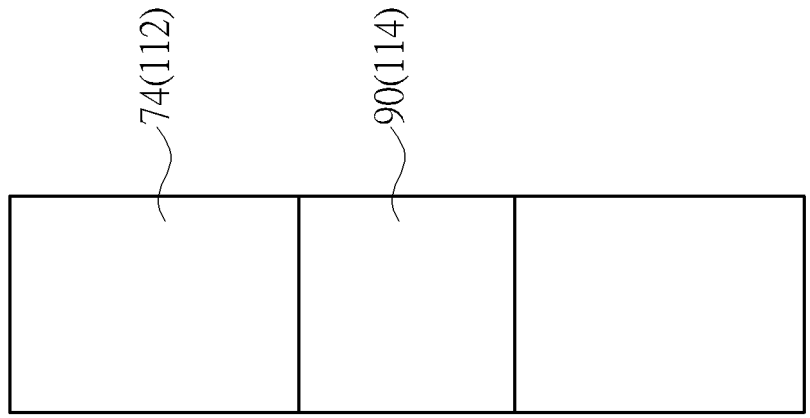
FIG. 7 illustrates a top view of metal interconnection overlapping MTJ on MTJ region and metal interconnection overlapping metal interconnection on logic region shown in FIG. 6 according to an embodiment of the present invention.
Figure 7:
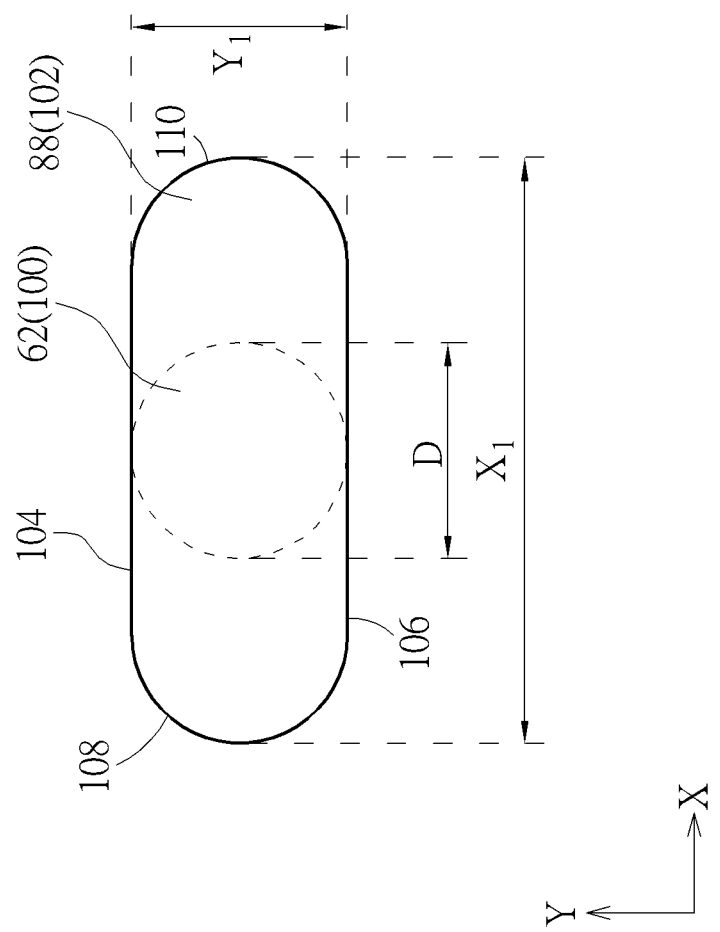

Referring to FIG. 7, FIG. 7 illustrates a top view of the metal interconnection 88 overlapping MTJ 62 and the metal interconnection 90 overlapping metal interconnection 74 shown in FIG. 6 according to an embodiment of the present invention. As shown in FIG. 7, the semiconductor device includes MTJ 62 disposed on the MTJ region 14, metal interconnection 88 disposed on the MTJ 62, metal interconnection 74 disposed on the substrate 12 on the logic region 16, and metal interconnection 90 disposed on the metal interconnection 74, in which the MTJ 62 and the metal interconnection 74 are preferably on a same level and the metal interconnection 88 and the metal interconnection 90 on the same level. Viewing from a top view perspective, the top view of the MTJ 62 preferably includes a circle 100, the top view of the metal interconnection 88 includes a flat oval 102 overlapping the circle 100 of the MTJ 62, and the top view of the metal interconnections 74, 90 on the logic region 16 includes either a rectangle or a square, in which the metal interconnection 74 includes a rectangle 112 while the metal interconnection 90 includes a square 114.

Viewing from a more detailed perspective, the flat oval 102 of the metal interconnection 88 includes a first tangent line 104 extending along a first direction (such as X-direction), a second tangent line 106 extending along the same first direction and the first tangent line 104 and the second tangent line 106 are in parallel, a first curve 108 on one side of the circle 100 to connect the first tangent line 104 and second tangent line 106, a second curve 110 on another side of the circle 100 to connect the first tangent line 104 and second tangent line 106, a long axis $X_1$ extending along the first direction, and a short axis $Y_1$ extending along a second direction (such as Y-direction) orthogonal to the first direction. In this embodiment, a ratio of the short axis $Y_1$ of the flat oval 102 to a diameter D of the circle 100 is greater than 0.7 and less than 1.3, and a ratio of the long axis $X_1$ to the diameter D of the circle 100 is greater than 2 and less than 3.3.

Figure 8:
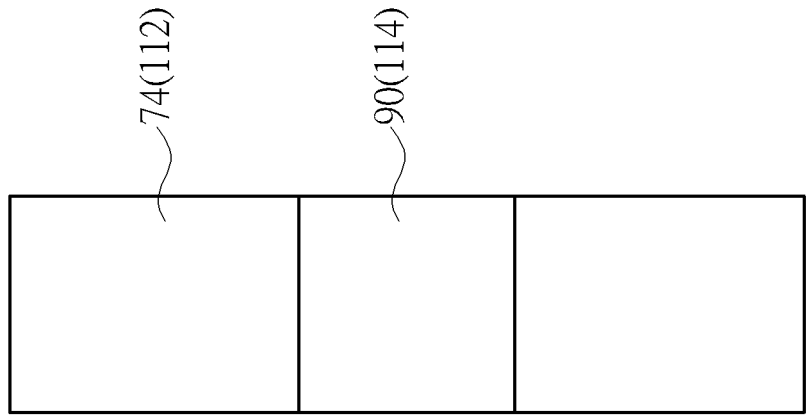
FIG. 8 illustrates a top view of metal interconnection overlapping MTJ on MTJ region and metal interconnection overlapping metal interconnection on logic region shown in FIG. 6 according to an embodiment of the present invention.
Figure 8:
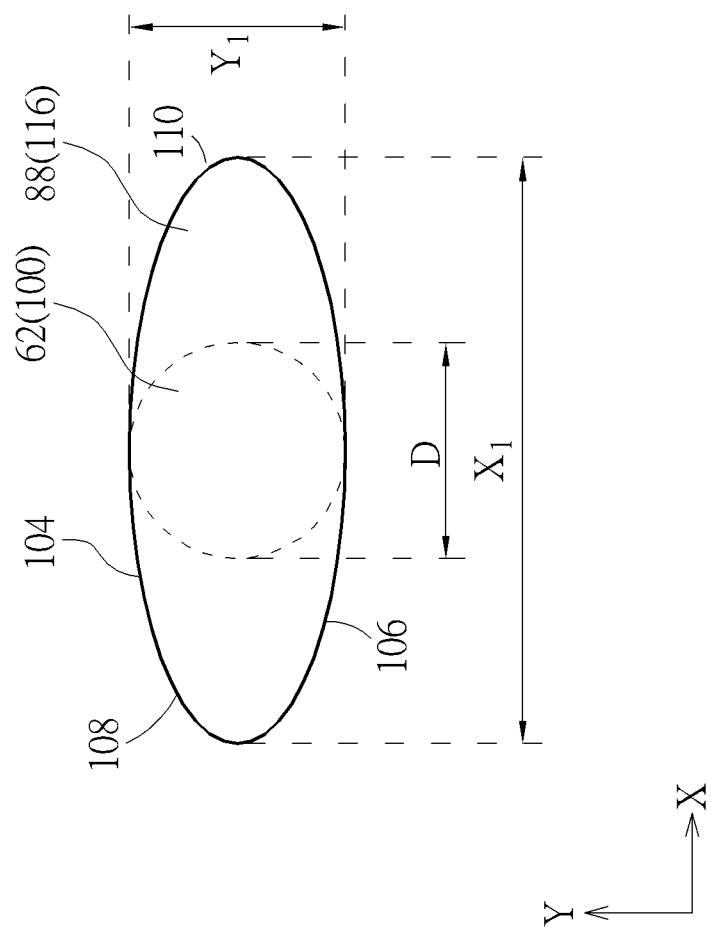

Referring to FIG. 8, FIG. 8 illustrates a top view of the metal interconnection 88 overlapping MTJ 62 and the metal interconnection 90 overlapping metal interconnection 74 shown in FIG. 6 according to an embodiment of the present invention. As shown in FIG. 8, the semiconductor device includes MTJ 62 disposed on the MTJ region 14, metal interconnection 88 disposed on the MTJ 62, metal interconnection 74 disposed on the substrate 12 on the logic region 16, and metal interconnection 90 disposed on the metal interconnection 74, in which the MTJ 62 and the metal interconnection 74 are preferably on a same level and the metal interconnection 88 and the metal interconnection 90 on the same level. Viewing from a top view perspective, the top view of the MTJ 62 preferably includes a circle 100, the top view of the metal interconnection 88 includes an ellipse 116 overlapping the circle 100 of the MTJ 62, and the top view of the metal interconnections 74, 90 on the logic region 16 includes either a rectangle or a square, in which the metal interconnection 74 includes a rectangle 112 while the metal interconnection 90 includes a square 114.

Viewing from a more detailed perspective, the ellipse 116 of the metal interconnection 88 includes a long axis $X_1$ extending along the first direction (such as X-direction) and a short axis $Y_1$ extending along a second direction (such as Y-direction) orthogonal to the first direction. Similar to the aforementioned embodiment, a ratio of the short axis $Y_1$ of the ellipse 116 to a diameter D of the circle 100 is greater than 0.7 and less than 1.3, and a ratio of the long axis) $X_1$ to the diameter D of the circle 100 is greater than 2 and less than 3.3.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having a magnetic tunneling junction (MTJ) region and a logic region;
   a magnetic tunneling junction (MTJ) on the MTJ region, wherein a top view of the MTJ comprises a circle; and
   a first metal interconnection on the MTJ, wherein a top view of the first metal interconnection comprises a flat oval overlapping the circle and an edge of the circle contacts an edge of the flat oval directly.

2. The semiconductor device of claim 1, wherein the flat oval comprises:
   a first tangent line extending along a first direction; and
   a second tangent line extending along the first direction, wherein the first tangent line and the second tangent line are in parallel.

3. The semiconductor device of claim 2, wherein the flat oval comprises:
   a first curve on one side of the circle and connecting the first tangent line and the second tangent line; and
   a second curve on another side of the circle and connecting the first tangent line and the second tangent line.

4. The semiconductor device of claim 2, wherein the flat oval comprises a short axis extending along a second direction and a ratio of the short axis to a diameter of the circle is greater than 0.7 and less than 1.3.

5. The semiconductor device of claim 4, wherein the first direction is orthogonal to the second direction.

6. The semiconductor device of claim 2, wherein the flat oval comprises a long axis extending along the first direction and a ratio of the long axis to a diameter of the circle is greater than 2 and less than 3.3.

7. The semiconductor device of claim 1, further comprising:

a second metal interconnection on the logic region, wherein a top view of the second metal interconnection comprises a quadrilateral.

8. The semiconductor device of claim 7, wherein the first metal interconnection and the second metal interconnection are on a same level.

\* \* \* \* \*